United States Patent [19]
Tsujino et al.

[11] Patent Number: 5,137,801
[45] Date of Patent: Aug. 11, 1992

[54] PROCESS FOR PRODUCING LIGHT CONTROL PLATE HAVING LIGHT-SCATTERING PERVIOUS REGION

[75] Inventors: Toshifumi Tsujino; Satoshi Ishizuka; Koichi Maeda, all of Osaka; Shinichiro Kitayama, Tsukuba; Shigeo Hozumi, both of Tsukuba, all of Japan

[73] Assignees: Nippon Sheet Glass Co., Ltd.; Sumitomo Chemical Company, Limited, both of Osaka, Japan

[21] Appl. No.: 531,683

[22] Filed: Jun. 1, 1990

[30] Foreign Application Priority Data

Jun. 5, 1989 [JP] Japan .................. 1-142582
Sep. 22, 1989 [JP] Japan .................. 1-247415

[51] Int. Cl.$^5$ .......................... G03F 1/02; G03C 5/00
[52] U.S. Cl. .................. 430/290; 430/396; 430/397
[58] Field of Search ............. 430/290, 396, 397

[56] References Cited

U.S. PATENT DOCUMENTS 4,777,116 10/1988 Kawatsuki et al. .............. 430/290
4,929,523 5/1990 Kitayama et al. ................ 430/4

FOREIGN PATENT DOCUMENTS 52-42721 4/1977 Japan ................................ 430/290

Primary Examiner—Cynthia Hamilton
Attorney, Agent, or Firm—Wenderoth, Lind & Ponack

[57] ABSTRACT

A process for producing a light control plate, which comprises
(1) preparing an assembly composed of a film of a photopolymerizing composition and a light pervious body having a light scattering pervious pattern arranged along the surface of the film and (2) irradiating light to the assembly from that side of the assembly on which the light pervious body exists, thereby to polymerize the photopolymerizable composition of the film and to form a light control plate having a light pervious region through which light advances straightforwardly defined by the light scattering pervious pattern.

7 Claims, 3 Drawing Sheets

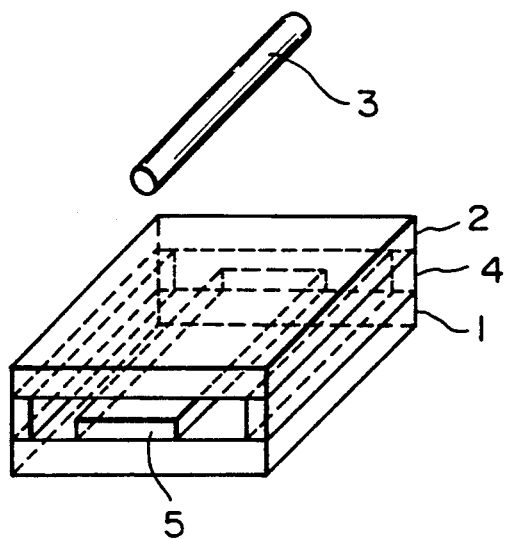
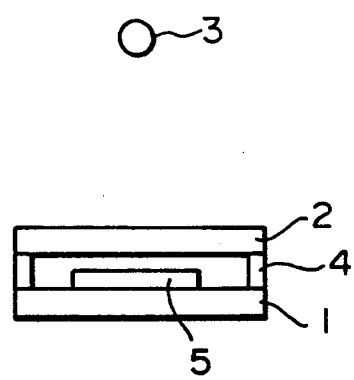
Fig. 1
Fig. 2
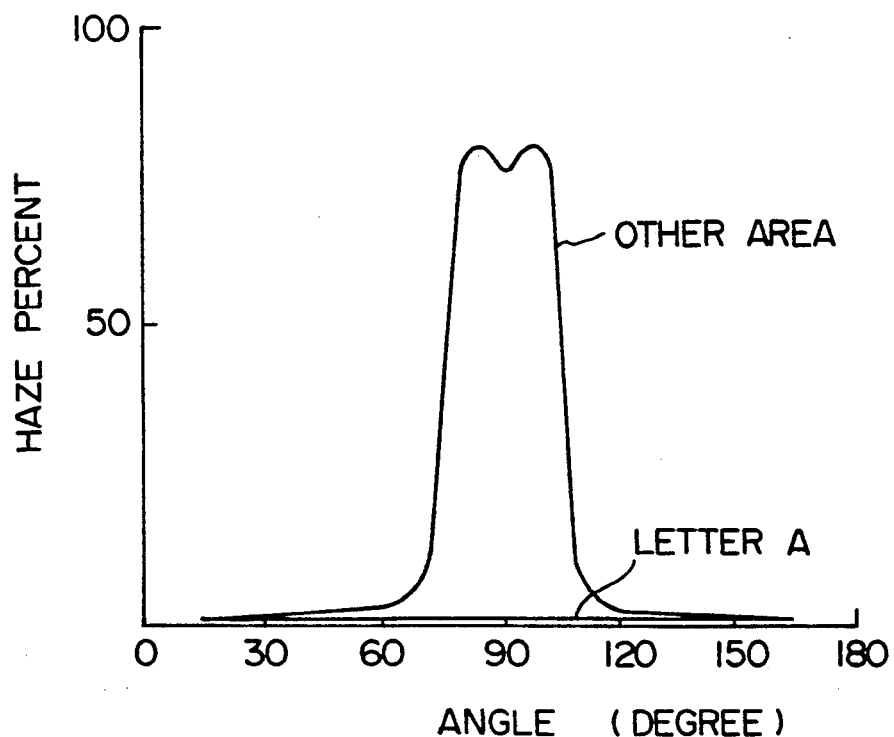
Fig. 4

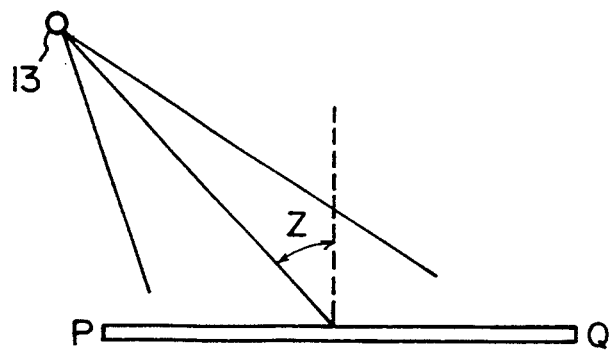
Fig. 7-b
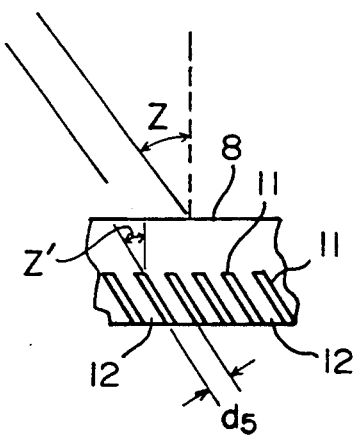
Fig. 7-a
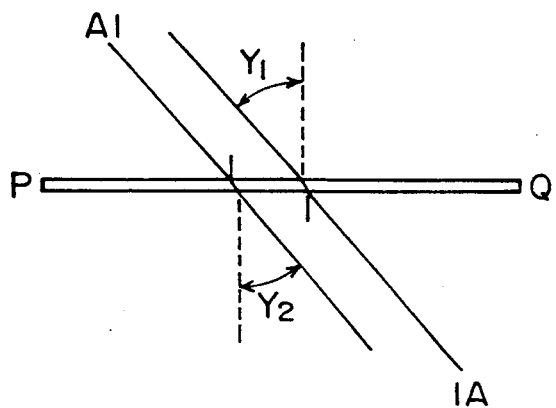
Fig. 8
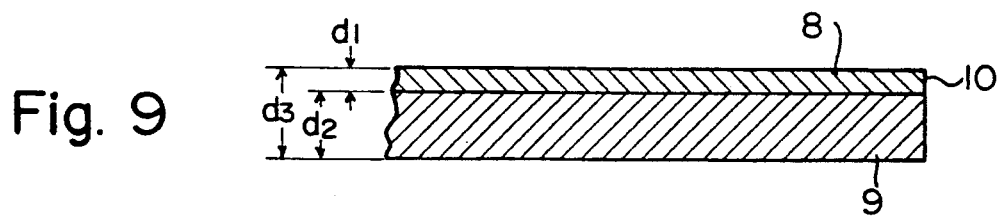
Fig. 9
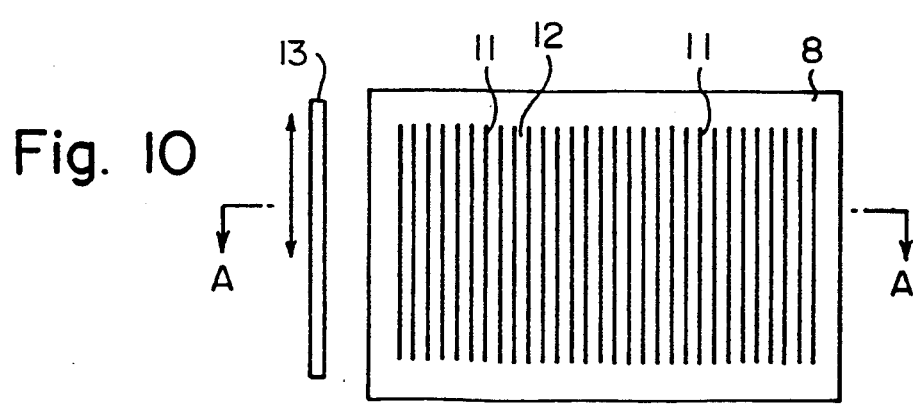
Fig. 10

PROCESS FOR PRODUCING LIGHT CONTROL PLATE HAVING LIGHT-SCATTERING PERVIOUS REGION

BACKGROUND OF THE INVENTION

This invention relates to a process for producing a light control sheet equipped with a light scattering pervious region and a straightwardly light-advancing pervious region.

Conventional transparent bodies made of plastics or glass are transparent to light rays from any angle. As a structure which is pervious to light falling only from a specific angle, a "light-shielding plate" has generally been used which is composed of a relief forming lattices or fringes on a transparent substrate using an oriented film cut out from a plastic block obtained by alternately bonding a transparent plastic sheet and a non-transparent plastic sheet or from a photosensitive resin, and a transparent plate further combined on the relief. Such a light-shielding plate is proposed, for example, in Japanese Laid-Open Patent Publication No. 189489/1982.

Conventional oriented films or light-shielding plates are very costly because the manufacturing methods for them are very complex, and the oriented films alone do not give homogeneous film quality.

Japanese Laid-Open Patent Publication No. 40902/1989 discloses a method of producing a light control plate having the function of scattering light rays which are incident at a predetermined angle, which comprises maintaining a resin composition comprising at least two photopolymerizable oligomers or monomers having different refractive indices in film form, and irradiating light from a specific direction to the film-like resin composition to cure it. The method more specifically comprises disposing a photomask having a first shape between a first linear light irradiating source and a film-like structure and irradiating light from the irradiating source, and simultaneously therewith, disposing a second linear light irradiating source located opposite to the first light irradiating source with respect to the film-like structure, disposing a photomask having a second shape between the irradiating source and the film-like structure, and irradiating light from the second irradiating source.

Japanese Laid-Open Patent Publication No. 40903/1989 discloses a method of producing a light control plate as in the method disclosed in the above-cited patent document, which comprises dividing the surface of the film-like structure into a plurality of regions, irradiating light from a linear light irradiating source to at least one region, and to another region, (A) irradiating light from the linear light irradiating source at different angles from the above irradiating source, or (B) irradiating light from a point light source, or applying parallel light, or (C) irradiating diffused light, or (D) applying heat.

Japanese Laid-Open Patent Publication No. 77001/1989 discloses a light control plate composed of a plastic sheet which selectively diffuses incident light having a specific angle of incidence, and a method for its production.

In the above manufacturing method, a rod-like lamp is used as a light source. The resin plate which cures under light irradiation shows anisotropy in the long and short axes of the light source. Only when the resin plate is rotated with respect to the long axis direction of the light source, does it scatter light at a predetermined angle only when rotated in the long axis of the light source. Specifically, the resulting resin plate exists while a region having a different refractive index is oriented in a certain direction, and light which falls at a specific angle is considered to be diffused by this structure.

In the above light control plate, as described in the above patent document, part of the substrate plate is transparent at the front and is non-transparent when tilted to any side, with the remainder having a reverse function. There may be prepared a light control plate in which a first portion of the substrate plate is nontransparent when viewed from the front, a second portion is always non-transparent and the remainder is always transparent.

According to the method described in the above patent document, a photopolymerizable composition containing at least two compounds having at least one polymerizable carbon-carbon double bond in the molecules and having different refractive indices is maintained in a film form, and light is irradiated from a specific direction to cure it. A portion of the surface of the filmlike structure is divided into a plurality of areas by covering it with a photomask. Light from a first linear light irradiating source is irradiated to at least one of the areas, for example, that portion which faces the opening of the photomask, and light from a second linear light irradiating source is irradiated to at least one other area, for example, a portion covered by the photomask, at a different angle from that applied from the first irradiation source to perform curing. If after this, there is still an unirradiated portion, curing is completed by applying light or by polymerizing it with heat. As a result, there can be obtained a light control plate in which various regions having various different angles of diffusion are provided in the film-like structure.

Instead of the second linear light irradiating source, light from a point light source, on light from a parallel light source may be irradiated, or it is also possible to irradiate diffusing light or to apply heat. If point light or parallel light is irradiated, there was obtained a light control film wherein that portion which was cured later became uniformly like frosted glass and that portion which was cured by the first light source became angle dependent.

When diffused light is irradiated, there is obtained a light control film wherein only that portion which was cured by the first light source has angle-dependence and that portion which was cured later becomes transparent. According to the afore-mentioned method, a light control plate may be produced which has various regions having different ranges of scattering angles in a single resin plate.

SUMMARY OF THE INVENTION

It is an object of this invention to provide a process for producing a light control plate having a light scattering pervious region and a straightforwardly light-advancing pervious region.

Another object of this invention is to provide a process for producing a light control plate whose light scattering pervious region permits scattering and transmission of light having a specified angle of incidence and permits light having other angles of incidence to advance straightforwardly, i.e. without scattering.

Still another object of this invention is to provide a process for producing a light control plate having the above scattering pervious region on an industrial scale.

Yet another object of this invention is to provide a process for continuously and very easily producing a light control plate having a relatively broad region which permits only light with a specific angle of incidence to scatter and transmit.

A further object of this invention is to provide a method of continuously producing a light control plate having a light scattering pervious pattern transferred clearly in the long axis direction of a linear light source.

An additional object of this invention is to provide a process for producing a light control plate, in which the light scattering pervious region permits scattering and transmission of light having any angle of incidence.

Other objects and advantages of this invention will become apparent from the following description.

The objects and advantages of this invention are firstly achieved by a process for producing a light control plate, which comprises (1) preparing an assembly comprising a film of a photopolymerizable composition and a light pervious body having a light scattering pervious pattern arranged along the surface of the film, wherein the photopolymerizable composition is selected from (a) an intimate mixture of at least two monomers having a polymerizable carbon-carbon double bond and being capable of forming polymers having different refractive indices, (b) at least one monomer having a plurality of polymerizable carbon-carbon double bonds in the molecule and (c) an intimate mixture of a compound having no polymerizable carbon-carbon double bond, and at least one monomer having a polymerizable carbon-carbon double bond and being capable of forming a polymer having a different refractive index from the refractive index of said compound, and (2) irradiating light to the assembly from that side of the assembly on which the light pervious body exists, thereby to polymerize the photopolymerizable composition of the film and to form a light control plate having a light pervious region through which light advances straightforwardly, defined by the light scattering pervious pattern.

BRIEF DESCRIPTION OF THE DRAWINGS

In the accompanying drawings:

FIG. 1 is a perspective view showing one example of a combination of an assembly of the polymerizable composition and a light pervious body having a light scattering pervious pattern, with a linear light source which is used in step (1) of the process of this invention.

FIG. 2 is a side elevation of an example of FIG. 1.

FIG. 4 shows the optical characteristics of a light control plate produced by the process of this invention.

FIGS. 7a, 7b, 8, 9 and 10 are views for illustrating the principle of this invention.

DESCRIPTION OF THE PREFERRED EMBODIMENTS

Figure 3:
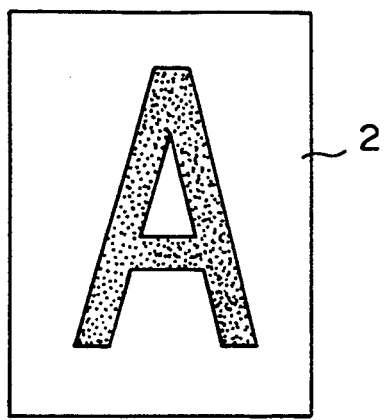
FIG. 3 shows one example of a light pervious body equipped with a light scattering pervious pattern A.

In the first step of the method of this invention, an assembly composed of a film of the photopolymerizable composition and a light-pervious body having a scattering pervious pattern arranged along the surface of the film is prepared.

The photopolymerizable composition contains an unsaturated compound having a polymerizable carbon-carbon double bond. The photopolymerizable composition is selected from (a) an intimate mixture of at least two monomers having polymerizable carbon-carbon double bonds and being capable of forming polymers having different refractive indices, (b) at least one monomer having a plurality of polymerizable carbon-carbon double bonds in the molecule, and (c) an intimate mixture of a compound free from bond and a polymerizable carbon-carbon double at least one monomer having a polymerizable carbon-carbon double bond and capable of forming a polymer having a refractive index different from that of the above compound.

The monomer constituting the intimate mixture (a) has a polymerizable carbon-carbon double bond Examples of suitable polymerizable double bonds are acryloyl, methacryloyl, vinyl and allyl groups.

Examples of such monomers include polyfunctional acrylates or the corresponding methacrylates such as polyester acrylates, polyol polyacrylates, modified polyol polyacrylates, polyacrylates having an isocyanuric acid skeleton, melamine acrylate, polyacrylate having a hydantoin skeleton, polybutadiene acrylate, epoxy acrylate, urethane acrylate, bisphenol A diacrylate, 2,2-bis(4-acryloxyethoxy-3,5-dibromophenyl)propane; monofunctional acrylates and the corresponding methacrylates such as methyl acrylate, tetrahydrofurfuryl acrylate, ethyl carbitol acrylate, dicyclopentenyloxyethyl acrylate, isobornyl acrylate, phenyl carbitol acrylate, nonyl phenoxyethyl acrylate, 2-hydroxy-3-phenoxypropyl acrylate, omega-hydroxyhexanoyloxy ethyl acrylate, acryloyloxyethyl succinate, acryloyloxyethyl phthalate, phenyl acrylate, tribromophenyl acrylate, phenoxy ethyl acrylate, tribromophenoxy ethyl acrylate, benzyl acrylate, p-bromobenzyl acrylate, 2-ethyl hexyl acrylate, lauryl acrylate, and 2,2,3,3-tetrafluoropropyl acrylate; vinyl compounds such as styrene, p-chlorostyrene, divinylbenzene, vinyl acetate, acrylonitrile, N-vinylpyrrolidone and vinylnaphthalene; and allyl compounds such as diethylene glycol bisallyl carbonate, diallylidene pentaerythritol, triallyl isocyanurate, diallyl phthalate and diallyl isophthalate. These compounds may be used as monomers or as oligomers.

In the intimate mixture (a), at least two monomers are used. They should be used in such a combination that will give homopolymers having different refractive indices. Combinations which give homopolymers whose difference in refractive index is greater are preferred. Advantageously, monomer combinations which give two homopolymers whose difference in refractive index is at least 0.01, preferably 0.05, are used. When three or more kinds of monomers are to be used, they are desirably combined such that the refractive indices of at least two of the resulting homopolymers differ from each other by 0.01, preferably 0.05.

In the intimate mixture (a), two monomers which will give homopolymers having the largest refractive index difference are used in a weight ratio of from 10:90 to 90:10.

Preferably, at least two homopolymers obtained from at least two monomers are not fully compatible with each other. If they have very high compatibility with each other, the resulting resin becomes completely uniform, and does not become hazy. If they have extremely poor compatibility with each other, phase separation occurs before photocuring takes place so that the haze percentage of the resulting resin rises too much. Hence, the resin becomes hazy throughout, and does not easily show a light controlling function.

As required, the intimate mixture (a) may contain a photopolymerization initiator.

There is no particular limitation on the photopolymerization initiator, and any initiators which are used in ordinary photopolymerization may be used. Examples include benzophenone, benzil, Michiler's ketone, 2-chlorothioxanthone, benzoin ethyl ether, diethoxyacetophenone, benzyl dimethyl ketal, 2-hydroxy-2-methylpropiophenone, and 1-hydroxycyclohexylphenylketone.

The intimate mixture (a) can be prepared by mixing at least two monomers and as required, a photopolymerization initiator with stirring.

Among the monomers having a plurality of polymerizable carbon-carbon double bonds in the molecule constituting the polymerizable composition (b), a compound having a plurality of polymerizable carbon-carbon double bonds in the molecule such as acryloyl, methacryloyl, vinyl or allyl groups may be advantageously used.

Examples of such a compound include triethylene glycol diacrylate, polyethylene glycol diacrylate, neopentyl glycol diacrylate, 1,6-hexanediol diacrylate, hydrogenated dicyclopentadienyl diacrylate, ethylene oxide modified bisphenol A diacrylate, trimethylol propane triacrylate, pentaerythritol hexaacrylate, trisacryloxy isocyanurate, polyfunctional epoxy acrylate, polyfunctional urethane acrylate, methacrylates corresponding to these acrylates, divinylbenzene, triallyl isocyanurate and diethylene glycol bis-allyl carbonate.

These compounds may be used as monomers or oligomers.

Advantageous among these compounds may be those whose refractive indices before curing differ from those after curing by at least 0.01, preferably at least 0.02.

Such compounds may be used singly or as a mixture of two or more together with a photopolymerization initiator, as required. The photopolymerization initiators that can be used may be the same as those described with reference to the intimate mixture (a).

The intimate mixture (c) is composed of a compound free from a polymerizable carbon-carbon double bond and at least one monomer having a polymerizable carbon-carbon double bond and having a refractive index different from the refractive index of the above compound.

Examples of such a compound include, polymers such as polystyrene, poly(methyl methacrylate), polyethylene oxide, polyvinyl pyrrolidone, polyvinyl alcohol and nylons; low-molecular-weight compounds such as toluene, n-hexane, cyclohexane, methyl alcohol, ethyl alcohol, acetone, methyl ethyl ketone, tetrahydrofuran, ethyl acetate, dimethylformamide, dimethylacetamide and acetonitrile; and plastic additives such as organic halogen compounds, organic silicon compounds, plasticizers and stabilizers.

The above monomers which constitute the intimate mixture (c) may be the same monomers as used in the intimate mixture (a) and the polymerizable composition (b).

In the intimate mixture (c), the compound having no polymerizable carbon-carbon double bond and the monomer having the above bond are advantageously used such that based on the total weight of the above compound and the monomer, the monomer having the above bond occupies 10 to 99% by weight, preferably 50 to 95% by weight.

Preferably, in the intimate mixture (c), the refractive index of the above compound differs from the refractive index of the homopolymer of the above monomer by at least 0.01, especially preferably 0.02.

In the step (1) of the method of this invention, the photopolymerizable composition is coated on a substrate such as a glass plate and formed into a film having a predetermined length and width. A light-pervious body having a scattering pervious pattern arranged along the surface of the film is provided. As a result, an assembly comprising the film of the photopolymerizable composition and the light-pervious body with the above pattern is prepared.

As the light-pervious body having the pattern, it is advantageous to use, for example, a light-pervious substrate itself, a substrate having a light-scattering pervious pattern formed by imparting fine raised and depressed portions to part of its surface, a substrate which itself has a body with a light-scattering light-pervious pattern, a substrate partly covered with a light-scattering light-pervious body capable of giving a light-scattering light-pervious pattern, or a substance on which to provide a body having a light-scattering light-pervious pattern (preferably, the body is provided at a distance within 3 mm from the surface of the substrate).

The film of the photopolymerizable composition constituting the assembly has a thickness of preferably at least 25 micrometers, more preferably at least 100 micrometers, especially preferably at least 200 micrometers.

According to the process of this invention, light is irradiated onto the assembly from that side where the light-pervious body exists in step (2). A linear light source, a point light source and a parallel light source may be used as the light source for irradiating light in this step. When the light source is a linear light source, that portion of the film, which is irradiated by light which passes through the light-scattering portion of the light-pervious body and becomes scattered light, is cured, and permits light to pass straightforwardly without scattering. In other words, this cured film portion gives a transparent visual field at any angle. On the other hand, that portion of the film which is irradiated by light which passes the straightforwardly passing portion of the light-pervious body scatters light falling at a specific angle of incidence and causes light incident at other angles to pass straightforwardly. In other words, this cured film portion gives a non-transparent visual field when viewed at a specific angle, and a transparent visual field when viewed from other angles. The linear light source has a long axis located nearly parallel to the film surface of the photopolymerizable composition and is provided in a space above the assembly.

The first linear light source used in this invention emits ultraviolet light or an actinic light ray which contributes to the photopolymerization of the photopolymerizable composition, and is in a linear form as viewed from an irradiated position (film surface). The size of the light source viewed from the irradiated position is such that the visual angle A of the light source in the direction of its long axis is at least 8°, preferably at least 12°. The size of the light source as viewed from the irradiated position is such that its visual angle B in the direction of its short axis is at most A/4, preferably at most A/10. A rod-like ultraviolet lamp is one preferred linear irradiating light source. When a rod-like ultraviolet lamp (3 KW) having a length of about 40 cm and a diameter of about 2 cm is provided 40 cm above a film having a size of 10 cm × 10 cm maintained horizontal so that it is parallel to the film surface, its visual angle A becomes about 54°, and the visual angle B becomes about 3°. The rod-like ultraviolet lamp is a first preferred linear light source in this invention. Besides this lamp, there can be used a light source which apparently looks linear as viewed from the irradiated position, a light source obtained by aligning many point light sources continuously in an apparently linear form, and a device designed to scan light from a laser light source (irradiated from many different angles from one irradiated point) by using a rotating mirror and a convex mirror).

If the irradiating light is ultraviolet light, a mercury lamp or a metal halide lamp is preferred in view of the ease of its handling as the rod-like ultraviolet lamp.

Preferably, the linear light source has a long axis which has an equal length to the length of the film of the photopolymerizable composition or a larger length than it.

In this case, as the length of the linear light source becomes larger, the light irradiated from the linear light source is easier to go rearwardly of the light-scattering light-pervious pattern in the long axis direction of the linear light source. Consequently, that film portion which is covered with the light-scattering pervious pattern is also polymerized and cured, and a portion which inherently should be transparent when viewed from any angle gives a non-transparent visual field when viewed from a certain range of angles.

To avoid this inconvenience, it is preferable to perform light irradiation from a linear light source through a light baffling plate arranged in a space between the linear light source and the assembly. A plurality of light baffling plates are arranged substantially perpendicularly to the surface of the assembly at equal intervals in the long axial direction of the linear light source in such a relation that the plate surfaces are opposite to each other. By irradiating light through the light baffling plates arranged as described above, light emitted from a certain position in the long axis direction of the linear light source, which if reaching a film portion relatively remote from the above position, goes rearwardly of the light-scattering pervious pattern, is hampered by the light baffling plates and fails to reach the above-mentioned film portion. In other words, by performing light irradiation through the light baffling plates, the light emittted from a certain position in the long axis direction of the linear light source can reach only a filmpart immediately below it and in its vicinity, and therefore, does not go rearwardly of the light-scattering pervious pattern.

The light baffling plate used in this invention may be any plate which can shut off light capable of photocuring, and preferably is of a small thickness.

On the other hand, when the light irradiating source is a point light source, a film portion which is irradiated and cured via a portion of the light pervious body which scatters and passes the irradiated light permits light at any angles of incidence to pass straightforwardly, and a film portion which is irradiated and cured through a straightforwardly passing portion of the light pervious body permits light of any angle of incidence to be scattered and passed.

According to this invention, a light control plate having a straightforwardly light-passing region defined by the light-scattering pervious pattern is produced by the above method.

According to the present invention, there is also provided a process of continuously producing a light control plate when the irradiating light source is a linear light source.

The continuous method of producing the light control plate provided by this invention comprises (1) preparing an assembly comprising a film of a photopolymerizable composition and a light-pervious body having a light-scattering pervious pattern arranged along the surface of the film, said photopolymerizable composition being selected from (a) an intimate mixture of at least two monomers having a polymerizable carbon-carbon double bond and being capable of forming polymers having different refractive indices, (b) at least one monomer having a plurality of polymerizable carbon-carbon double bonds in the molecule, and (c) an intimate mixture of a compound having no polymerizable carbon-carbon double bond, and at least one monomer having a polymerizable carbon-carbon double bond and being capable of forming a polymer having a different refractive index from the refractive index of said compound, (2) while continuously moving the assembly in the plane direction of the film, irradiating light from that side where the pervious body is present onto the assembly at a limited angle to thereby polymerize the photopolymerizable composition of the film, said light being emitted from a linear light source provided in a space above the assembly so that its long axis is positioned nearly parallel to the surface of the film and in a direction crossing the moving direction of the assembly, thus forming a light control plate having a region which scatters and passes only light with a specified angle of incidence and straightforwardly passes incident light at other angles, and a region which straightforwardly passes incident light from any angle.

In the continuous production process (to be referred to simply as the continuous process), step (1) is quite the same as step (1) in the aforesaid process.

In the continuous process, then in step (2), the assembly is then irradiated from that side where the light pervious body exists at a limited angle while the assembly is continuously moved in the planar direction of the film. At this time, light to be irradiated is emitted from a linear light source which is provided so that its long axis is positioned in a direction crossing the moving direction of the assembly.

By irradiating light onto the assembly at a limited angle from that side where the light pervious body exists, there can be obtained a light control plate having a region which scatters light of specific angles alone defined by a straightforwardly light advancing portion corresponding to a portion of the light straightforwardly advancing pervious pattern of the light pervious body. That is to say, there can be obtained a light control plate having a region which shows anisotropy with respect to the long axis and short axis directions of the linear light source and therefore a region which scatters light of a specific angle only when the linear light source is rotated with the long axis direction as an axis of rotation, and also a region which is transparent when viewed from all angles corresponding to the above pattern. In step (2), while the assembly is moved, light from the linear light source disposed so that its long axis is positioned in a direction crossing the moving direction of the assembly, for example, light partly cut by a irradiation angle limiting means provided between the assembly and the linear light source, namely that portion of light which falls upwardly with respect to the moving direction of the assembly is cut, and the resulting light is irradiated on the moving assembly through the light pervious body. In other words, since in step (2) of this invention, only that portion of light which falls downstream in the moving direction of the assembly is irradiated onto the assembly, the light is irradiated at a limited angle. Thus, by the step (2), the assembly always receives light irradiation from the linear light source through the light pervious body at a fixed angle in the moving direction of the assembly. This makes it possible to produce a light control plate having a region where the angle of incident light to be scattered is fixed.

The irradiation angle limiting means is provided, for example, so that it shuts off the moving assembly from light irradiation in the moving direction. The shape of the tip portion of the irradiation angle limiting means for limiting the irradiation angle on the assembly is preferably a straight line.

Desirably, the above linear light source is provided so that the length of its long axis is equal to the length crossing at right angles to the moving direction of the assembly, or is larger than it.

As the length of the linear light source becomes larger, irradiating light from the linear light source is easier to go rearwardly of the light-scattering pervious pattern in the direction of the long axis of the linear light source. To avoid this, it is preferred to provide light baffling plates as described hereinabove.

A film portion which is irradiated with light coming through a light straightforwardly advancing zone of the light pervious body (the zone other than the light-scattering pervious pattern) and cured has a selective light-scattering function permitting scattering of only incident light having a specified angle. This will be described with reference to the accompanying drawings.

Above a horizontally placed unpolymerized film, for example about 40 cm above it and tilted at about 45° measured from a perpendicular surface upstanding from the center of the film surface, the above linear light source is placed horizontally so that the lengthwise direction of the light source becomes parallel to the perpendicular surface, and light is irradiated from it to induce a curing reaction of the film. Consequently, anisotropy occurs in the resulting cured film. When the sectional surface of the cured film is viewed as shown in FIG. 9, a layer 9 of a microstructure is formed inside the cured film whose irradiated surface is indicated by 8. The thickness d2 of the layer 9 is about 25 to 5000 microns, and the depth d1 from the surface to the layer 9 is 0 to 100 microns. The thickness d1 varies depending upon the atmosphere in which the curing reaction of the film takes place. The thickness d3 of the layer 9 is usually 25 to 5000 micrometers. As shown in FIG. 10 which is a top plan view and FIG. 9 which is a sectional view, the microstructural layer 9 is composed of a large number of elongated fine structures 11 and 12 extending nearly parallel to the linear light source 13. As shown in FIG. 7-a which is taken on line A-A of FIG. 10, each of the minute structures 11 and 12 is tilted by an angle $Z'$ which is smaller than the irradiating direction of light from the irradiating source shown in FIG. 7-b. This angle $Z'$ is nearly equal to the angle of refraction at which the irradiated light is refracted and advances. The pitch d5 between the minute structures 11 or 12 is 0.1 to 20 micrometers.

The selective light scattering is such that in FIG. 8, light Al which is incident at an angle $Y1$ equal to an irradiation angle $Z$ from the irradiation source, and light 1A which is incident at an angle $Y2$ on the opposite side of the film are most strongly scattered. In other words, when the sight ahead of the film is viewed at that angle through this film, the vision becomes most hazy and is screened.

The incident light is not always an incident light parallel to the sheet surface in FIG. 8, but the incident light which falls onto the film through a plane perpendicular to the sheet surface and including light of the incident angle $Y1$ or $Y2$ (the angle of incidence measured by projecting on the sheet surface is equal to $Y1$ or $Y2$) is also most strongly scattered. The haze percents to light of various angles of incidence shows a chevron-shape graphic configuration in which the angle of incidence is largest near $Z$. If the size of the irradiating light source becomes small, and the long axis becomes a visual angle A of less than 50°, the polymerized film no longer shows anisotropy, and scatters incident light in any direction.

If the size of the irradiating light source gradually becomes larger, the height of the chevron in the graph of the haze percent becomes lower. When the size of the irradiating light source becomes larger than a visual angle B of 100°, it no longer shows anisotropy. The irradiated polymerized film is transparent when viewed in any direction, and the film does not show selective light scattering.

Examples of such a light source are a planar light source provided relatively near the film to be polymerized, and a diffusion light source. When the film is polymerized by heating, it becomes transparent.

It is not certain why a film polymerized by using a linear light source shows selective light scattering. In FIG. 10, the microstructures 11 and 12 have different indices of refraction (such differences in index of refraction greatly has to do with the difference in index of refraction between homopolymers of photopolymerizable monomers used as starting materials), and light which falls at an angle near the inclination angle $Z$ of the microstructure presumably is diffracted and scattered in the boundary between regions having different angles of diffraction. The angle selectivity is determined by the distance between layer structures by the angle selectivity of diffraction. Specifically, as the distance between layers is smaller, angles of scattering become greater. The haze percent which expresses the degree of scattering is affected by the disturbance of the layer structure. Specifically, the haze percent becomes higher as the disturbance is greater. If the same layer structure has a disturbance, as the film thickness becomes larger, the distance over which light passes becomes longer. Hence, the degree of scattering is amplified, and the haze percent becomes higher.

If the irradiating light source is a planar light source or a diffusion light source, such a microstructure is not formed, and the film is transparent and does not show selective light scattering. Further, if the irradiating light source is a point light source, a microstructure is formed in the film. But there is no regularity as in the case of a linear light source. The microstructures are arranged at random, and therefore, any incident light reflects within a microstructure and the film gives light scattering having no directionality.

The following Examples illustrate the present invention more specifically.

EXAMPLE 1

A polymerizable composition was prepared from 100 parts of polyether urethane acrylate (refractive index 1.481) composed of polypropylene glycol, hydroxyethyl acrylate and isophorone diisocyanate, 100 parts of tribromophenoxy ethyl acrylate (refractive index 1.567) and 6 parts of hydroxy isobutylphenone. This composition was poured onto a glass substrate having a size of 40 cm ×40 cm with a thickness of 2 mm, and formed into a film 5. On the other hand, as shown in FIG. 3, a mask glass sheet 2 (light-pervious body) having a size of 25 cm ×40 cm with a thickness of 300 micrometers was prepared with its surface coarsened by sand blasting. As shown in FIGS. 1 and 2, the film 5 of the polymerizable composition was placed with its surface upwardly, and around the glass substrate 1, a spacer having a height of 1 mm was disposed. The light-pervious body 2 having the roughened surface downwardly was held on the substrate glass. A rod-like ultraviolet lamp 3 (80 W/cm, 2 kw; diameter 2 cm; light emitting length 25 cm) was provided 50 cm above the glass substrate 1 in the perpendicular direction. It was set horizontally and being parallel to the side ab of the glass substrate 1. The ultraviolet light from the lamp 3 was irradiated on the polymerizable composition of the film 5 through the masked glass plate 2 to cure it. The cured film was peeled from the glass substrate 1. A film-like light control plate was obtained. When this light control plate was viewed from the front in the direction in which the lamp was set up, the portion of the figure A looked transparent, and the other portions looked non-transparent. When, the light control plate was rotated at an angle of at least 25 degrees to the left and right in the axial direction of the side ab, portions other than the letter A also looked transparent, and the contour of the letter A completely got out of sight.

By using an integrating sphere-type light transmission measuring device in accordance with JIS K-6714, the total light transmission and scattered light transmission of this light control plate were measured with respect to the portion of the letter A and other part, and the haze percent was calculated. The above haze percent was calculated by tilting the light control plate around an axis parallel to the side ab and allowing light to fall in a direction parallel to the side ab thereby to vary the angle between the incident light and the light control plate. FIG. 4 shows variations in haze percent with respect to the angle of incidence.

The dotted line shows the haze percent of the portion of letter A, and the solid line, the haze percent in portions other than the letter A. Specifically, irrespective of the incidence angle of the portion of the letter A, the absolute value of the haze percent in the portion of the letter A is not more than 1%. In portions other than the letter A, the haze percent of an incident light at an angle of incidence of 90 degrees is about 75% (absolute value).

EXAMPLE 2

A light control plate was prepared under the same conditions as in Example 1 except that a small spherical ultrahigh-pressure mercury lamp (20 mm ×20 mm) was used instead of the rod-like lamp. When viewed at any angle, the resulting light control plate looked transparent in the portion of letter A, and the other portion looked non-transparent.

EXAMPLE 3

Figure 6:
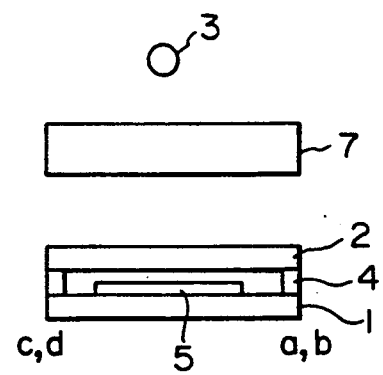
FIG. 6 is a rough side elevation of the apparatus shown in FIG. 5.
Figure 5:
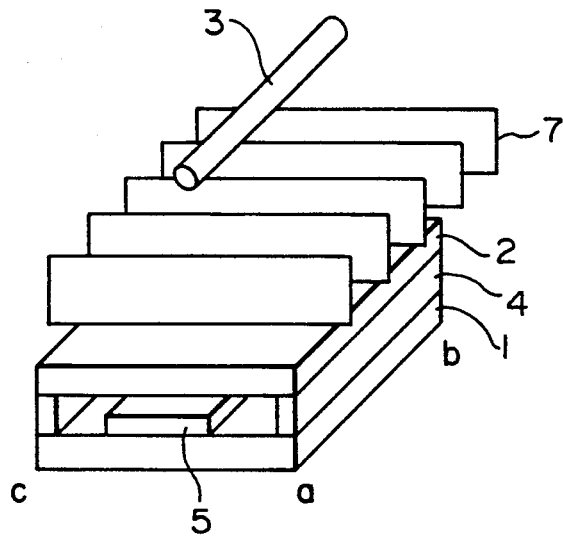
FIG. 5 is an outline perspective view for illustrating an embodiment of this invention including an apparatus equipped with light baffling plates for practicing the process of this invention.

One hundred parts of polyurethane acrylate (refractive index 1.490) obtained by the reaction of polytetramethylene ether glycol having an average molecular weight of 20,000, toluene diisocyanate and 2-hydroxyethyl acrylate was mixed with 100 parts of triacrylate and 6 parts of benzyl methyl bromophenoxyethyl ketal to prepare a polymerizable composition. The composition was poured into a glass substrate 1 having a size of 40 cm ×40 cm with a thickness of 2 mm and formed into a film 5 having a size of 25 cm ×40 cm with a thickness of 300 micrometers. A masked glass plate 2 having a size of 40 cm ×40 cm with a thickness of 2 mm having a lattice pattern with longitudinal lines having a width of 2 mm and lateral lines having a width of 5 mm with the other portion being roughened by sand blasting was prepared. As shown in FIGS. 5 and 6, the polymerizable composition film 5 was placed upwardly and around the glass substrate 1 was arranged a spacer 4 having a height of 2 mm. The masked glass plate 2 was held on the glass substrate with the ground surface of the masked glass plate 2 downward. A rod-like lamp 3 (30 W/cm, 2.1 kw; diameter 2 cm, emitting length 70 cm) was placed 70 cm above the glass substrate perpendicularly at the center of the substrate 1. It was placed horizontally and parallel to the side ab of the glass substrate 1. Thirteen light baffling plates 7 of aluminum (20 cm ×20 cm, 3 mm thick) whose surfaces were anodized) were arranged at intervals of 5 cm at a position 15 cm below the lamp. By the ultraviolet lamp 3, ultraviolet light was irradiated onto the film 5 of the polymerizable composition through the masked glass plate 2 and cured. The cured film was peeled from the glass substrate 1, and a film-like light control plate was obtained.

When this light control plate was viewed from the front in the direction in which the lamp was set up, the lattic pattern portion looked non-transparent, and the other portions looked transparent. Portions other than the lattice pattern looked transparent at any angle. When the light control plate was rotated through 25 degrees to the left and right in the axial direction of the side ab, the lattice pattern portion also looked transparent, and the contour of the lattice pattern got completely out of sight.

When the light control plate was viewed in the front in the direction in which the lamp was set up, and the non-transparent longitudinal and lateral line widths of the lattice pattern. The width of the longitudinal lines was 2.05 mm, and the width of the lateral lines was 5 mm.

A light control plate was prepared by the same procedure as above except that the light baffling plates were not used.

When the light control plate was viewed at the front in the direction in which the lamp was set up, the width of the longitudinal lines and the lateral lines in the non-transparent lattice pattern was 2.9 mm at the longitudinal lines and 5 mm at the lateral lines.

EXAMPLE 4

Figure 11:
FIG. 11 is a rough view illustrating the apparatus for continuously practicing the process of this invention.

The same composition as in Example 1 was poured onto a glass substrate 21 with a size of 70 cm ×40 cm, and formed into a film 25 having a size of 70 cm ×25 cm with a thickness of 300 micrometers. On the other hand, a masked glass plate (light-pervious body) 22 having a size of 70 cm ×40 cm with a thickness of 2 mm was prepared by sand blasting its surface with a pattern of letter A as shown in FIG. 3. A spacer 24 having a height of 1 mm was set up around the glass substrate 21 with the film 25 of the polymerizable composition upward, and the light-pervious body 22 with its ground surface downward and held on the substrate glass. As shown in FIG. 11, the assembly 26 was placed on rotating roll 28 spaced from each other by a distance of 30 cm. The rolls 28 were rotated at a fixed speed, and the assembly 26 was horizontally placed so that its advancing direction is at right angles to the ab direction in FIG. 1. The assembly 26 was moved (in the right direction in the drawings) at a rate of 40 cm/min. A rod-like ultraviolet lamp 23 (80 KW/cm, 5.6 KW, lamp diameter 2 cm, lamp length 70 cm) was set up so that its longitudinal direction is horizontal and to the shaft of the rolls 28, namely it was parallel to the width direction ab of the assembly 26. Furthermore, thirteen light baffling plates 27 of aluminum with a thickness of 3 mm with its surface having an area of 20 cm ×20 cm anodized perpendicularly to the long axis of the lamp 23 were arranged at intervals of 5 cm below the rod-like ultraviolet lamp 23. An irradiation angle limiting means 29 was placed immediately above the upper surface of the assembly 26. The forward end portion of the irradiation angle limiting means 29 was located parallel to the shaft of the roll at a position perpendicular from immediately below the rod-like ultraviolet lamp 23. By the rotation of the rolls 28, while the assembly 26 was moved, ultraviolet light from the rod-like ultraviolet lamp 23 was irradiated onto the polymerizable composition of the film 25 via the light pervious-body 22 assembly 26 to cure the polymerizable composition. The cured film 25 was peeled from the glass substrate 21 to give a film-like light control plate. When this light control plate was observed at the front, a transparent letter A was seen in a hazy surrounding. The shape and size of the transparent letter A were quite the same as the letter A of the light-pervious body. When the light control plate was tilted to left and right at an angle of at least about 20 degrees with respect to the side ab, the entire surface of the light control plate became transparent and the letter was not seen.

We claim:

1. A process for producing a light control plate, which comprises
   (1) preparing an assembly comprising a film of a photopolymerizable composition and a light pervious body having a light scattering pervious pattern arranged along the surface of the film, wherein the photopolymerizable composition is selected from the group consisting of
      (a) an intimate mixture of at least two monomers having a polymerizable carbon-carbon double bond and being capable of forming polymers having different refractive indices,
      (b) at least one monomer having a plurality of polymerizable carbon-carbon double bonds in the molecule, and
      (c) an intimate mixture of a compound having no polymerizable carbon-carbon double bond, and at least one monomer having a polymerizable carbon-carbon double bond and being capable of forming a polymer having a different refractive index from the refractive index of said compound,
   and (2) irradiating light to the assembly from that side of the assembly on which the light pervious body exists thereby to polymarize the photopolymarizable composition of the film and to form a light control plate having a light pervious region through which light advances straightforwardly, defined by the light scattering pervious pattern.

2. The method of claim 1 in which the light to be irradiated onto the assembly in step (2) is emitted from a linear light source which has a long axis positioned nearly parallel to the surface of the photopolymarizable composition and disposed in a space above the assembly, and the light control plate formed in step (2) has a region which scatters and passes only light at a specific angle of incidence and forwardly passing light having other angles of incidence, and a region which straightforwardly passes incident light at any angle.

3. The method of claim 1 in which the light irradiation in step (2) is carried out through a plurality of light baffling plates disposed in a space between a linear light source and the assembly, and the baffling plates are arranged substantially vertically to the plane of the assembly with the individual surfaces facing each other and at equal intervals in the longitudinal axis direction of the linear light source.

4. The method of claim 1 in which the light for irradiating the assembly in step (2) is emitted from a point light source disposed in a space above the assembly, or a parallel light, and the light control plate formed in step (2) has a region which scatters and passes light at any angle of incidence and a region which straightforwardly passes light at any angles of incidence.

5. A process for continuously producing a light control plate, which comprises
   (1) preparing an assembly comprising a film of a photopolymerizable composition and a light-pervious body having a light-scattering pervious pattern arranged along the surface of the film,
   said photopolymerizable composition being selected from the group consisting of
      (a) an intimate mixture of at least two monomers having a polymerizable carbon-carbon double bond and being capable of forming polymers having different refractive indices,
      (b) at least one monomer having a plurality of polymerizable carbon-carbon double bonds in the molecule, and
      (c) an intimate mixture of a compound having no polymerizable carbon-carbon double bond, and at least one monomer having a polymerizable carbon-carbon double bond and being capable of forming a polymer having a different refractive index from the refractive index of said compound, (2) while continuously moving the assembly in the plane direction of the film, irradiating light from that side where the pervious body is present onto the assembly at a limited angle to thereby polymarize the photopolymarizable composition of the film, said light being emitted from a linear light source provided in a space above the assembly so that its long axis is positioned nearly parallel to the surface of the film and in a direction crossing the moving direction of the assembly, thus forming a light control plate having a region which scatters and passes only light with a specified angle of incidence and straightforwardly passes incident light at other angles, and a region which straightforwardly passes incident light from any angle.

6. The process of claim 5 in which in step (2), the light cut by an irradiation angle limiting means positioned between the assembly and the linear light source and is irradiated at a limited angle onto the assembly.

7. The process of claim 5 in which the light irradiation in step (2) is carried out through a plurality of light baffling plates disposed in a space between the linear light source and the irradiation angle limiting means, and the baffling plates are arranged substantially vertically to the plane of the assembly with the individual surfaces facing each other and at equal intervals in the longitudinal axis direction of the linear light source.

* * * * *